(12) United States Patent
Birtcher et al.

(10) Patent No.: US 11,166,441 B2
(45) Date of Patent: Nov. 9, 2021

(54) VAPOR DELIVERY CONTAINER WITH FLOW DISTRIBUTOR

(71) Applicant: Versum Materials US, LLC, Tempe, AZ (US)

(72) Inventors: Charles Michael Birtcher, Tempe, AZ (US); Robert Eschbach, Tempe, AZ (US); William Jon Sheehy, Tempe, AZ (US); James Patrick Nehlsen, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 148 days.

(21) Appl. No.: 16/456,279

(22) Filed: Jun. 28, 2019

(65) Prior Publication Data

US 2020/0016558 A1 Jan. 16, 2020

Related U.S. Application Data

(60) Provisional application No. 62/697,658, filed on Jul. 13, 2018.

(51) Int. Cl.
| | | |
|---|---|---|
| *B01J 4/00* | (2006.01) | |
| *A01K 63/04* | (2006.01) | |
| *B65D 8/00* | (2006.01) | |
| *B65D 51/24* | (2006.01) | |
| *C23C 16/448* | (2006.01) | |
| *B65D 25/38* | (2006.01) | |

(52) U.S. Cl.
CPC ............. *A01K 63/042* (2013.01); *B01J 4/001* (2013.01); *B01J 4/005* (2013.01); *B65D 7/04* (2013.01); *B65D 51/24* (2013.01); *C23C 16/4481* (2013.01); *B65D 25/38* (2013.01); *B65D 2251/20* (2013.01)

(58) Field of Classification Search
CPC .............. A01K 63/042; C23C 16/4481; C23C 16/455; B01J 4/005; B01J 4/001; B65D 7/04; B65D 51/24; B65D 25/38; B65D 2251/20; H01L 21/67011
USPC ....................................................... 261/119.1
See application file for complete search history.

(56) References Cited

U.S. PATENT DOCUMENTS

| | | |
|---|---|---|
| 6,033,479 A | 3/2000 | Ikeda |
| 6,698,728 B1 | 3/2004 | Ravetz et al. |
| 8,313,804 B2 | 11/2012 | Carlson et al. |
| 2002/0078894 A1 | 6/2002 | Timmons et al. |

(Continued)

FOREIGN PATENT DOCUMENTS

TW          201742674         12/2017

*Primary Examiner* — Huy Tram Nguyen
(74) *Attorney, Agent, or Firm* — Daniel A. DeMarah, Jr.

(57) ABSTRACT

A chemical precursor container is disclosed. The container includes a vessel and a lid that define an interior volume, an inlet conduit, an outlet conduit, and a flow distributor positioned inside the vessel and in fluid flow communication with the inlet conduit. The flow distributor has an annular shape and includes a distributor floor having a plurality of apertures formed therein for expelling carrier gas therethrough. The flow distributor includes an inner annular wall that defines a porthole in the flow distributor that allows fluid to pass through the flow distributor from the interior volume of the vessel to the outlet conduit.

10 Claims, 11 Drawing Sheets

(56) References Cited

U.S. PATENT DOCUMENTS

2010/0021631 A1* 1/2010 Moriyama ........ C23C 16/45565
427/255.23
2017/0327945 A1 11/2017 Birtcher et al.

* cited by examiner

■ Downward Flow    ▫ Horizontal/Slow Flow    ▨ Upward Flow

■ Low Shear Strees    ▫ Moderate Shear Stress    ▨ High Shear Stress

■ Downward Flow    □ Horizontal/Slow Flow    ▨ Upward Flow

■ Low Shear Strees    □ Moderate Shear Stress    ▨ High Shear Stress

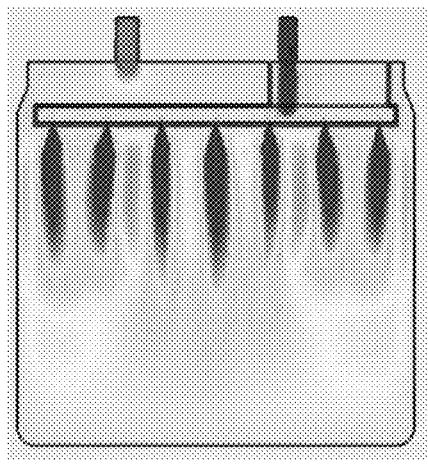
FIG. 6A                          FIG. 7A
■ Downward Flow     ░ Horizontal/Slow Flow     ▒ Upward Flow
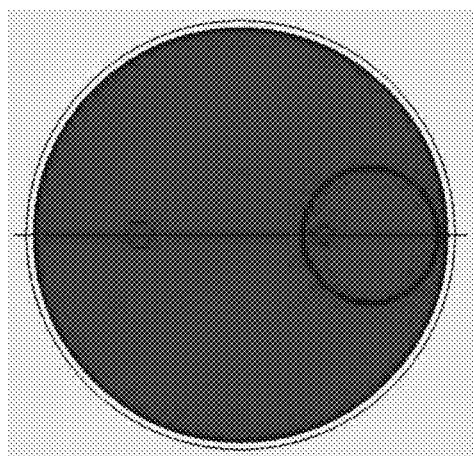     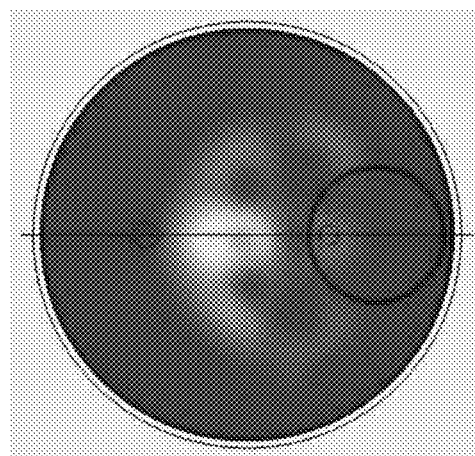
FIG. 6B                          FIG. 7B
■ Low Shear Strees     ░ Moderate Shear Stress     ▒ High Shear Stress

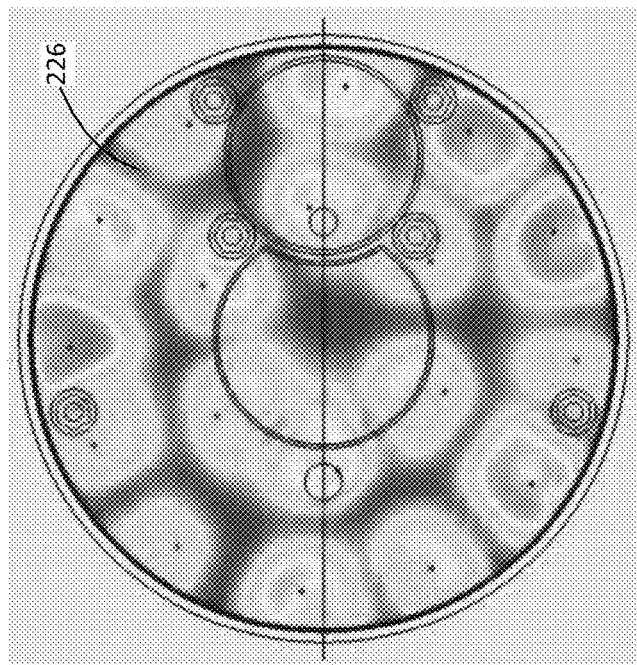
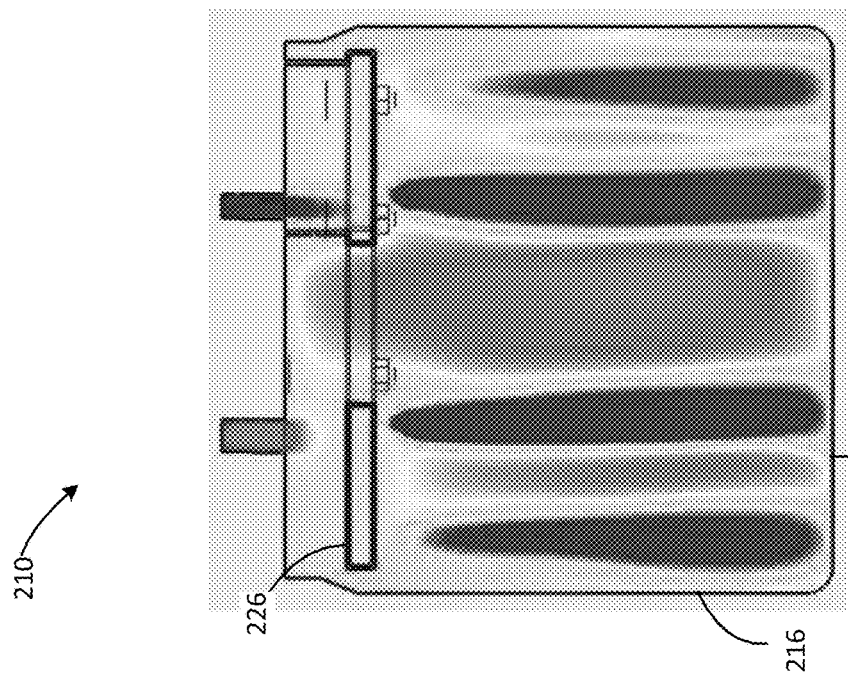
FIG. 12B
- Low Shear Strees
- Moderate Shear Stress
- High Shear Stress
FIG. 12A
- Downward Flow
- Horizontal/Slow Flow
- Upward Flow

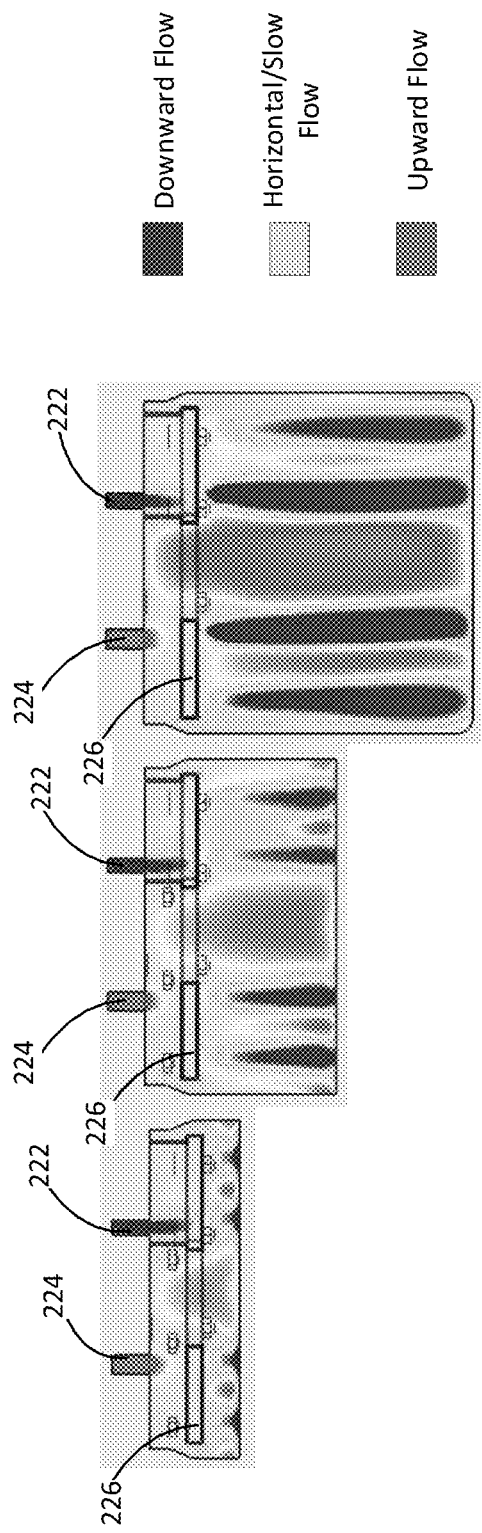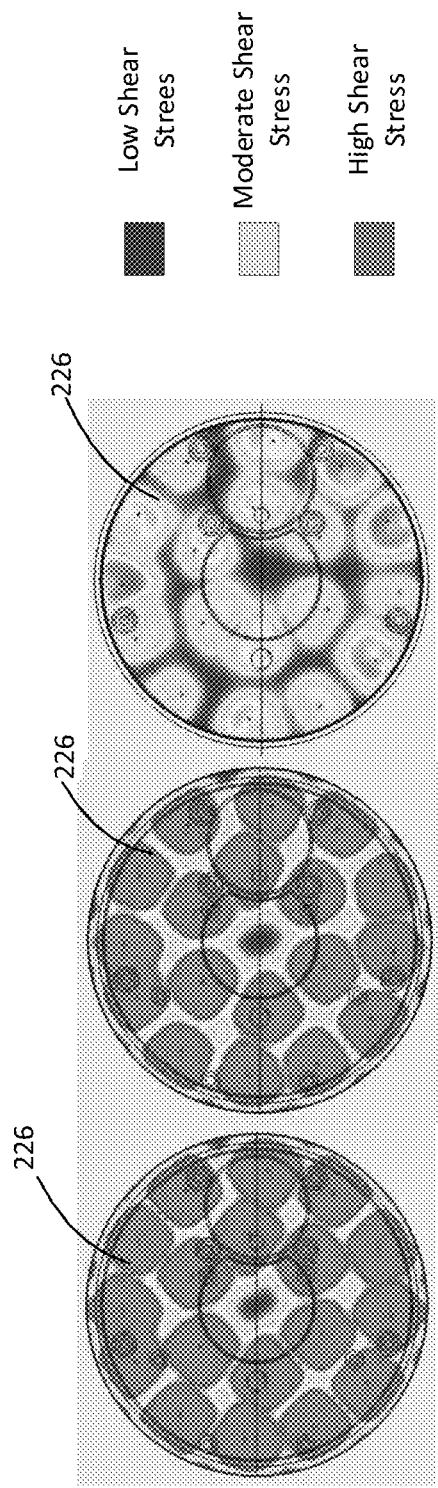
FIG. 13A  FIG. 13C  FIG. 13E
FIG. 13B  FIG. 13D  FIG. 13F

VAPOR DELIVERY CONTAINER WITH FLOW DISTRIBUTOR

CROSS REFERENCE TO RELATED PATENT APPLICATIONS

This application claims the benefit of priority under 35 U.S.C. § 119(e) to earlier filed U.S. patent application Ser. No. 62/697,658, filed on Jul. 13, 2018, which is entirely incorporated herein by reference.

BACKGROUND

The electronic device fabrication industry requires various chemicals as raw materials or precursors to fabricate integrated circuits and other electronic devices. Deposition processes such as, chemical vapor deposition (CVD) and atomic layer deposition (ALD) processes, are used in one or more steps during the manufacture of a semiconductor device to form one or more films or coatings on the surface of a substrate. In a typical CVD or ALD process, a precursor source that may be in a solid and/or liquid phase is conveyed to a reaction chamber having one or more substrates contained therein where the precursor reacts under certain conditions such as temperature or pressure to form the coating or film on the substrate surface.

There are several accepted technologies to supply a precursor vapor to a processing chamber. One process supplies the liquid precursor to a processing chamber in a liquid form with the flow rate controlled by a liquid mass flow controller (LMFC) and then the precursor is evaporated by a vaporizer at the point of use. A second process involves a liquid precursor being evaporated by heating and the resulting vapor is supplied to a chamber with the flow rate controlled by a mass flow controller (MFC). A third process involves bubbling a carrier gas upwardly through the liquid precursor. A fourth process involves enabling the carrier gas to flow over the surface of the precursor contained in a canister and carrying precursor vapor out of the canister and subsequently to the process tool.

Described herein are containers, systems and methods using same for delivering high purity process chemical precursors to a process tool that is used in the manufacture of a semiconductor device. More specifically, described herein are systems comprising a container (a vessel or an ampoule) with flow distributor, such as multiple small holes or jets; and chemical precursors for a process tool such as a deposition reactor in a chemical vapor deposition (CVD) or atomic layer deposition (ALD) process.

The delivery of chemical vapor from a solid precursor by sublimation, is one of the subject matters of the present invention.

One challenge associated with conventional containers that deliver chemical vapor from a solid precursor by sublimation is difficulty in obtaining high utilization of precursor. It is difficult to minimize the amount of precursor left in the container when it is taken out of service to be cleaned and refilled. One cause of this problem is that, in conventional solid source containers, the distance between the surface of the precursor and the inlet and outlets used to circulate the carrier gas, as well as the volume of the area in which the carrier gas contacts the precursor vapor, increases as the precursor is exhausted.

Attempts have been made to increase precursor utilization, including more uniform heating of the precursor chamber and improved carrier gas circulation. Although these efforts have resulted in improvements in precursor utilization, the structures needed to implement these improvements can make the containers more difficult to clean and there is a need for further improvement in the precursor utilization.

Some prior art designs position the inlet conduit above the precursor surface but don't provide sufficient momentum for carrier gas to perturb the surface of the precursor at low container fill level or at low load level. Thus, precursor delivery rate for prior art designs is typically significantly lower at low container fill level (or at low load level) compare to precursor delivery rate at high container fill level (or at high load level).

Prior solutions include container designs where the inlet conduit is positioned below the precursor surface. Precursors (liquid or solid) are supplied in bubblers. Wherein in use, a carrier gas is bubbled through and becomes saturated with the precursor via a dip pipe. Such designs are disclosed in U.S. Pat. Nos. 8,313,804 B2, 6,698,728 and 6,033,479, the disclosures of which are incorporated by reference herein in their entireties. However, these designs often present problems for delivery of solid precursors due to inlets getting clogged with solids, non-uniform delivery rate due to carrier gas channeling around the solids, and delivery rate variation during container utilization.

Thus, there is a need for a system that delivers precursors to a deposition or process site that overcomes the aforementioned drawbacks.

SUMMARY

In view of the foregoing, a chemical precursor container is disclosed. The container includes a vessel including a vessel floor, a vessel sidewall extending from the floor to an upper vessel edge, and a lid that spans a radial distance from a center axis of the vessel to the upper vessel edge, the vessel floor, vessel sidewall, and lid of the vessel defining an interior volume in the vessel, the vessel having an exterior surface and an interior surface; an inlet conduit extending through the lid from the top surface of the lid to the bottom surface of the lid; a flow distributor positioned inside the vessel and in fluid flow communication with the inlet conduit, the flow distributor including at least one conduit having a plurality of apertures formed therein for expelling gas from the inlet conduit into the vessel; and an outlet conduit extending through the lid from the bottom surface of the lid to the top surface of the lid. The flow distributor has an annular shape and includes a distributor floor, a distributor ceiling, an outer distributor sidewall that extends from an outer perimeter of the distributor floor and an outer perimeter of the distributor ceiling, and an inner distributor sidewall that extends from an inner perimeter of the distributor floor to an inner perimeter of the distributor ceiling. The distributor floor and distributor ceiling extend radially from the inner perimeters to the outer perimeters thereof, and the inner distributor side wall defines a porthole in the flow distributor that allows fluid to pass through the flow distributor from the interior volume of the vessel to the outlet conduit.

In one embodiment, the plurality of apertures are formed in the distributor floor of the flow distributor and are arranged in a plurality of concentric annular arrays of apertures that include an inner array of apertures and an outer array of apertures. In one embodiment, the inner array of apertures are radially offset from the outer array of apertures.

In one embodiment, the flow distributor and the vessel are in axial alignment, the vessel has an interior vessel radius, the outer array of apertures is positioned radially between 65% and 80% of the interior vessel radius, and the inner array of apertures is positioned radially between 30% and 45% of the interior vessel radius.

In one embodiment, each of the inner array of apertures is substantially equidistant from its neighboring apertures in the inner array of apertures. In another embodiment, each of the outer array of apertures is substantially equidistant from its neighboring apertures in the outer array of apertures.

In one embodiment, the porthole of the flow distributor and the vessel are in axial alignment, the vessel has an interior vessel radius, and the porthole has a radius that is between 30% and 35% of the interior vessel radius.

The container can have any shape. The shape includes but is not limited to cylindrical, rectangular cuboid, right cuboid, rectangular box, rectangular hexahedron, right rectangular prism, or rectangular parallelepiped; and with a cross section of circle, oval, square, rectangle or any other shape used in the art.

BRIEF DESCRIPTION OF THE DRAWINGS

For a more complete understanding of the present invention, reference is made to the following detailed description of embodiments considered in conjunction with the accompanying drawings, in which:

FIG. 6A is a side elevational view of a fluid flow diagram of the delivery container shown in FIG. 2 having a showerhead flow distributor with a third pattern of jets;

FIG. 6B is a top plan view of the fluid flow diagram shown in FIG. 6A;

FIG. 7A is a side elevational view of a fluid flow diagram of the delivery container shown in FIG. 2 having a showerhead flow distributor with a fourth pattern of jets;

FIG. 7B is a top plan view of the fluid flow diagram shown in FIG. 7A;

FIG. 12A is a side elevational view of a fluid flow diagram of the chemical precursor container shown in FIG. 8;

FIG. 12B is a top plan view of the fluid flow diagram shown in FIG. 12A;

FIG. 13A is a side elevational view of a fluid flow diagram of the chemical precursor container shown in FIG. 8 when at maximum fill;

FIG. 13B is a top plan view of the fluid flow diagram shown in FIG. 13A;

FIG. 13C is a side elevational view of a fluid flow diagram of the chemical precursor container shown in FIG. 8 when half-full;

FIG. 13D is a top plan view of the fluid flow diagram shown in FIG. 13C;

FIG. 13E is a side elevational view of a fluid flow diagram of the chemical precursor container shown in FIG. 8 when empty; and FIG. 13F is a top plan view of the fluid flow diagram shown in FIG. 13E.

DETAILED DESCRIPTION

Figure 1:
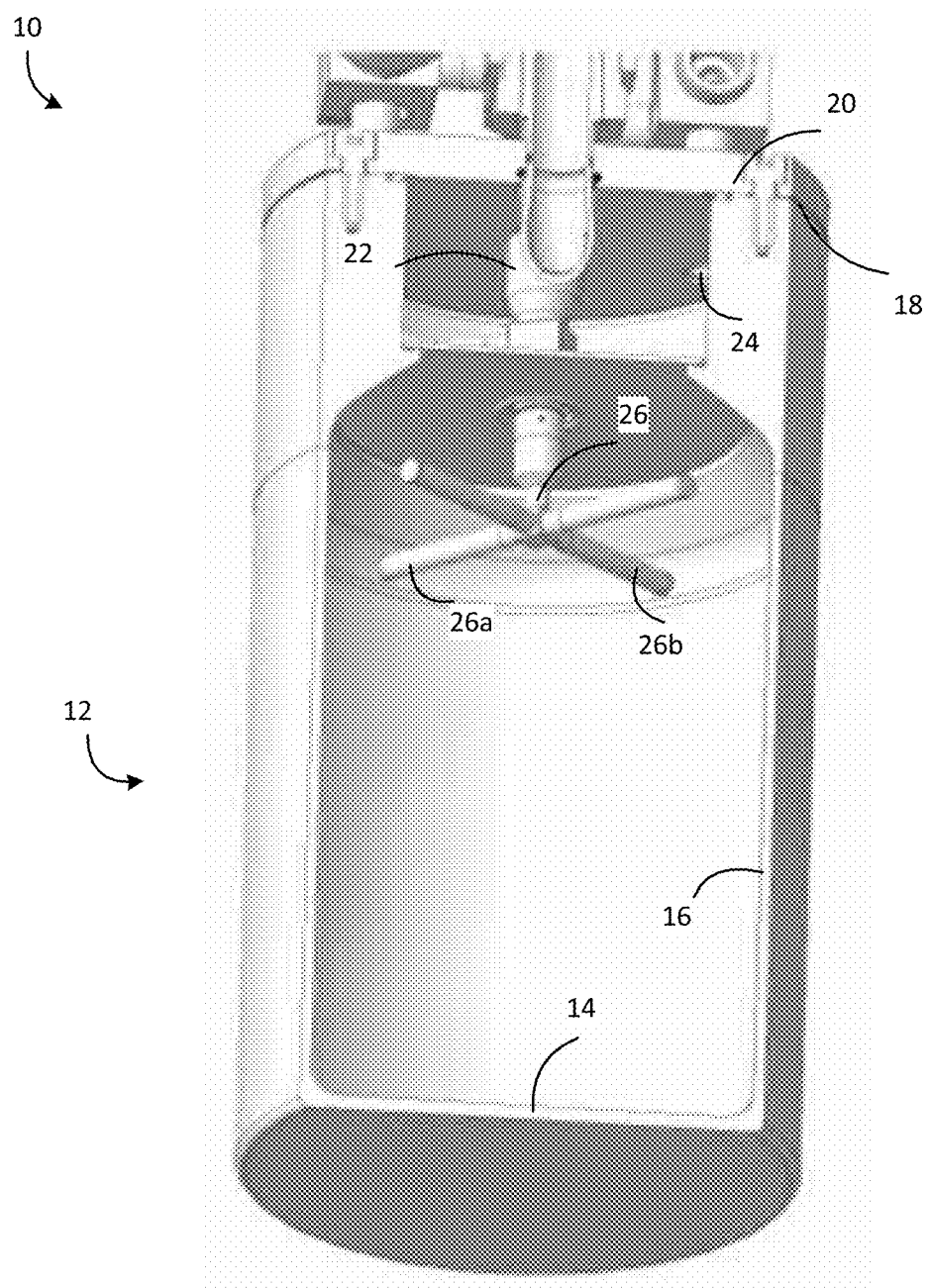
FIG. 1 is a bottom perspective view of a prior art container with a cut-away showing an inlet conduit extending into a prior art hollow cross shape flow distributor.

The following disclosure is presented to provide an illustration of the general principles of the present invention and is not meant to limit, in any way, the inventive concepts contained herein. Moreover, the particular features described in this section can be used in combination with the other described features in each of the multitude of possible permutations and combinations contained herein.

All terms defined herein should be afforded their broadest possible interpretation, including any implied meanings as dictated by a reading of the specification as well as any words that a person having skill in the art and/or a dictionary, treatise, or similar authority would assign particular meaning. Further, it should be noted that, as recited in the specification and in the claims appended hereto, the singular forms "a," "an," and "the" include the plural referents unless otherwise stated. Additionally, the terms "comprises" and "comprising" when used herein specify that certain features are present in that embodiment, but should not be interpreted to preclude the presence or addition of additional features, components, operations, and/or groups thereof.

The following disclosure is intended to be read in connection with the accompanying drawings, which are to be considered part of the entire written description of the invention. The drawing figures are not necessarily to scale and certain features of the invention may be shown exaggerated in scale or in somewhat schematic form in the interest of clarity and conciseness. In this description, relative terms such as "horizontal," "vertical," "up," "down," "top," "bottom," as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both moveable or rigid attachments or relationships, unless expressly described otherwise, and includes terms such as "directly" coupled, secured, etc. The term "operatively coupled" is such an attachment, coupling, or connection that allows the pertinent structures to operate as intended by virtue of that relationship.

In order to aid in describing the invention, the following terms are defined and used in the specification:

The term "conduit", may be used in the specification and claims, refers to one or more structures through which fluids can be transported between two or more components of a system. For example, conduits can include pipes, ducts, passageways, and combinations thereof that transport liquids, vapors, and/or gases.

The term "flow communication," as used in the specification and claims, refers to the nature of connectivity between two or more components that enables liquids, vapors, and/or gases to be transported between the components in a controlled fashion (i.e., without leakage). Coupling two or more components such that they are in flow communication with each other can involve any suitable method known in the art, such as with the use of welds, flanged conduits, gaskets, and bolts.

The term "electric communication", as used in the specification and claims, refers to the use of electronics to operate the system or method described herein and can be constructed within in one or more of the bulk chemical cabinet and/or solvent supply cabinet system, or may be placed in a separate enclosure and connected to the main system components through cables and tubing as required for a specific setup. In one particular embodiment, the electronics enclosure is placed on top of the cabinet and connected through feedthroughs into the main cabinet or alternatively located in a chemically isolated region of the main cabinet. In certain embodiments, the electronics control system such as the source control module (SCM) or source controller electronic (SCE) generally consists of a micro-controller, a microprocessor, a PLC (programmable Logic Controller) or another type of computer that conducts the functions of sequencing the system, monitoring alarms, communicating to various vessels such as without limitation, spent solvent vessels, solvent recovery vessels, bulk process chemical vessel, chemical recovery vessel, bulk solvent vessel, and the main processing tool. This communication can take place using "Direct digital control" that generally takes the form of a series of input and output relays, optically isolated to prevent stray interference from causing problems or a variety of other means. This communication may also take place using a serial interface such as an RS-232 link, IEEE 485, Modbus, DeviceNet, or using a computer network interface, such as Ethernet, or wireless protocols and is not limited thereto.

The term "Reynolds number" is a dimensionless quantity used in fluid mechanics known in the art. The Reynolds number is defined as the mathematical product of the velocity of the fluid, the equivalent diameter of the pipe that the fluid is passing, and the density of the fluid, divided by the dynamic viscosity of the fluid. For flow in a cylindrical pipe, the internal diameter is generally used as the equivalent diameter. Other shapes such as rectangular pipes or non-cylindrical pipes the equivalent diameter is defined as $D_E = 4A/P$, where A is the cross sectional area and P is the perimeter of the cross-section. For flow through a hole or orifice, the equivalent diameter of the hole or orifice and the average velocity of the fluid as it passes through the hole or orifice are used.

The present invention relates to improvements to precursor utilization in vessels used to deliver a precursor-containing fluid stream to a deposition process, as well as simplifying the cleaning and refilling of such vessels. More specifically, described herein are systems and methods for providing one or more process chemicals to a process tool designed for manufacturing semiconductors, and for allowing such a process chemical to be easily and efficiently cleaned from its process chemical container or ampoule, as well as other associated components in the delivery system.

In one aspect, the containers that are used to deliver chemical precursor can have many shapes, including but not limited to cylindrical, rectangular cuboid, right cuboid, rectangular box, rectangular hexahedron, right rectangular prism, and rectangular parallelepiped shapes; and with a cross section of circle, oval, square, rectangle or any other shape used in the art. The volume of the containers to the process tool ranges from 100 milliliters (ml) to 10 liters. Alternative names for the containers described herein include "Ampoules", "Vessels", "Source Containers", "Hosts" and other proprietary names. The containers described herein may further include a means for initially filling and cleaning the reservoir.

Figure 2:
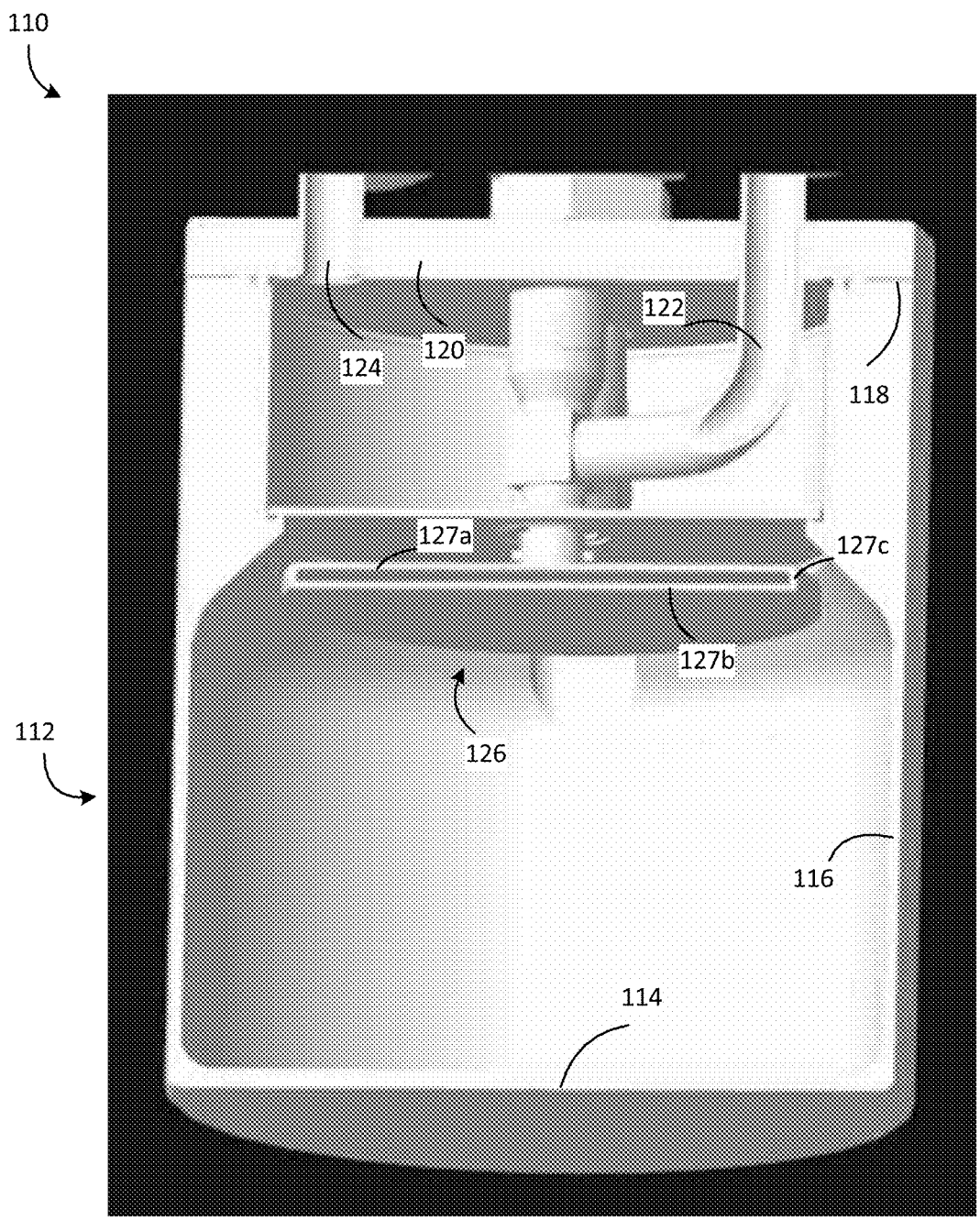
FIG. 2 is a bottom perspective view of a prior art container with a cutaway showing an inlet conduit extending into a showerhead shape flow distributor.

Two prior art containers 10, 110 are shown in FIGS. 1 and 2. Each container 10, 110 includes a vessel 12, 112 that has a vessel floor 14, 114, a vessel sidewall 16, 116 extending from the vessel floor 14, 114 to an upper vessel edge 18, 118, and a lid 20, 120 that provides an air-tight seal against the upper vessel edge 18, 118. The vessel floor 14, 114, vessel sidewall 16, 116, and lid 20, 120 of each container 10, 110 define an interior volume in which a chemical precursor is housed. Each container 10, 110 also includes an inlet conduit 22, 122 and an outlet conduit 24, 124, both of which extend through their respective lid 20, 120, with the inlet conduit 22, 122 terminating inside the vessel 12, 112 at a flow distributor 26, 126. The inlet conduit 22, 122 is configured to allow inert gas to flow into the container 10, 110 through the flow distributor 26, 126, which forces the carrier gas downwardly to perturb the surface of the chemical precursor inside the vessel 12, 112 and assist in its sublimation. The carrier gas then pushes the sublime chemical vapor out of the outlet 24, 124 of the container. The input conduit 22, 122 and the output conduit 24, 124 are connected to an input valve (not shown) and an output valve (not shown), respectively, to regulate the flow of carrier gas entering the container 10, 110 and the flow of chemical vapor exiting the container 10, 110.

FIG. 1 shows one embodiment of a flow distributor 26 having a cross shape, with two tubular hollow members 26a, 26b (such as bars, pipes) extending parallel to the lid surface and being in fluid-flow communication with inlet conduit 22. Each of the hollow members 26a, 26b of the flow distributor 26 has a plurality of small openings (not shown in FIG. 1) as jets located on the bottom part of each of the hollow members 26a, 26b at an angle ranging from 60 to 90 degrees to the bottom surface of the lid 20. FIG. 2 shows a second embodiment of a flow distributor 126 having a hollow disc "showerhead" shape, with a showerhead ceiling 127a and a showerhead floor 127b that are joined by a showerhead sidewall 127c. Like the cross-shaped flow distributor 26, the showerhead flow distributor 126 includes a plurality of small openings (not shown in FIG. 2) as jets located in the showerhead floor 127b and angled 60 to 90 degrees to the bottom surface of the lid 120. Additional details regarding the containers shown in FIGS. 1 and 2 are disclosed in U.S. Patent Application Pub. No. 2017/0327945 A1, the disclosure of which is incorporated by reference herein in its entirety.

Figure 3A:
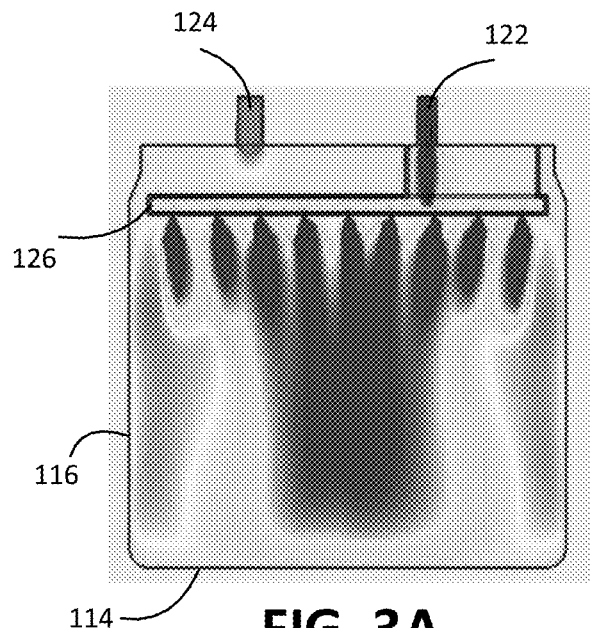
FIG. 3A is a side elevational view of a fluid flow diagram of the delivery container shown in FIG. 2, the diagram showing the flow pattern of gas flowing into the delivery container from the flow distributor, where the color blue indicates downward flow, red/orange indicates upward flow, and green indicates horizontal flow.
Figure 3B:
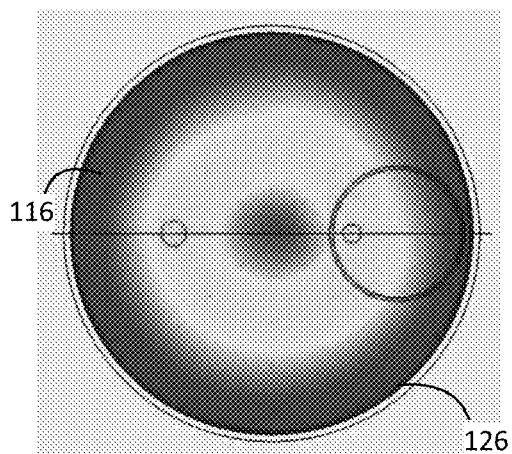
FIG. 3B is a top plan view of the fluid flow diagram shown in FIG. 3A showing the sheer stress exerted at the floor of the container.
Figure 4A:
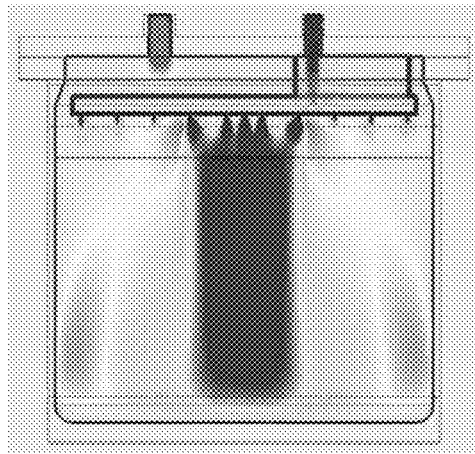
FIG. 4A is a side elevational view of a fluid flow diagram of the delivery container shown in FIG. 2 having a showerhead flow distributor with a first pattern of jets.
Figure 5A:
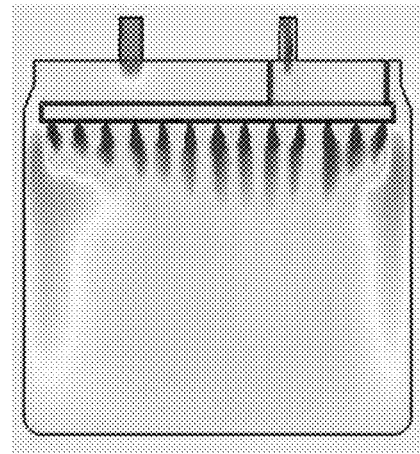
FIG. 5A is a side elevational view of a fluid flow diagram of the delivery container shown in FIG. 2 having a showerhead flow distributor with a second pattern of jets.
Figure 4B:
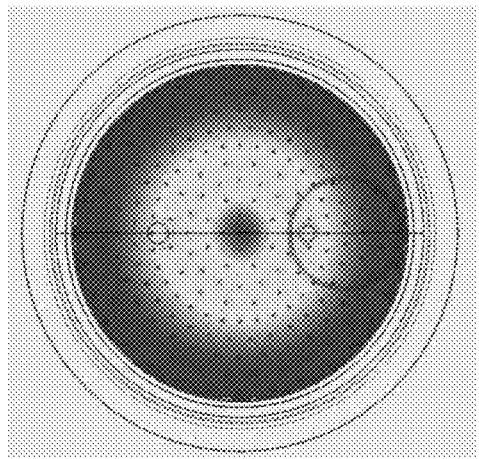
FIG. 4B is a top plan view of the fluid flow diagram shown in FIG. 4A.
Figure 5B:
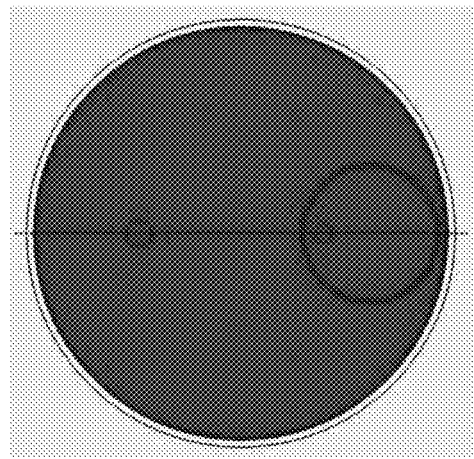
FIG. 5B is a top plan view of the fluid flow diagram shown in FIG. 5A.

However, experimentation with the containers shown in FIGS. 1 and 2 has found that these flow distributor designs have difficulty getting the carrier gas from the inlet of the container to impinge chemical precursor proximate to the vessel floor of the container. FIG. 3A illustrates the flow pattern of gas inside a container with the showerhead flow distributor 126 shown in FIG. 2 having a plurality of radially spaced jets, while FIG. 3B shows the sheer stress the carrier gas imparted on the precursor surface inside the container. To facilitate consideration and understanding, the blue portions of FIGS. 3A and 3B illustrate downward flow of gas, the orange/red portions show upward flow of gas, and the green portions show horizontal or slow flow of gas. As seen in FIG. 3A, the outer jets of the showerhead flow distributor get blocked by the upward flow of gas leaving the container, and while the inner jets are able to push gas closer to the bottom, they do not fully impinge on the surface of the precursor. As a result, the precursor surface received little disturbance, as seen in FIG. 3B.

Many alternative designs were explored to try to improve the performance of the showerhead flow distributor 126. Such designs included changes the hole size of the jets, changes the angle in which the jets expelled carrier gas (see FIGS. 4A, 4B), increases or decreases the number of jets in the flow distributor 126 (see FIGS. 5A, 5B and 6A, 6B), and changes to the hole pattern of the jets (see FIGS. 7A, 7B). FIGS. 4A-7B show the unfavorable results of four such designs. As can be seen, none of these designs caused carrier gas expelled from the jets to reach the bottom of the container.

Success was achieved with the container 210 shown in FIGS. 8-11, which illustrate an exemplary embodiment of the present invention. The elements illustrated in FIGS. 8-11 which correspond, either identically or substantially, to the elements described above with respect to the embodiment shown in FIG. 2 have been designated by corresponding reference numbers increased by one hundred. Any element referenced below and identified in the attached drawings should be assumed as having the same or similar structure and function as its corresponding element shown in previous figures, except where specifically indicated otherwise below.

Figure 8:
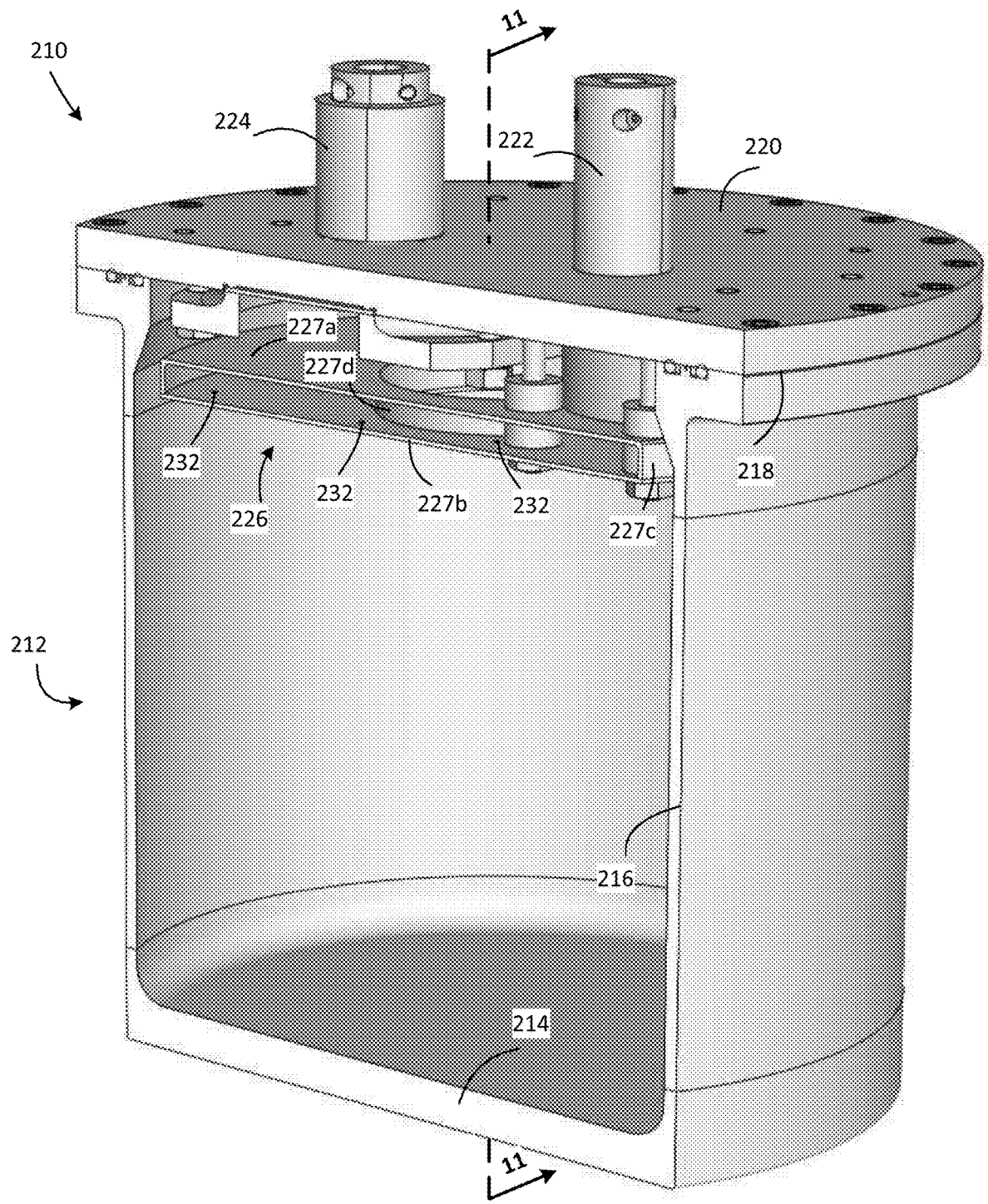
FIG. 8 is a perspective view of a chemical precursor container constructed in accordance with an embodiment of the present invention, the view including a cutaway of the flow distributor and interior of the chemical precursor container.
Figure 9:
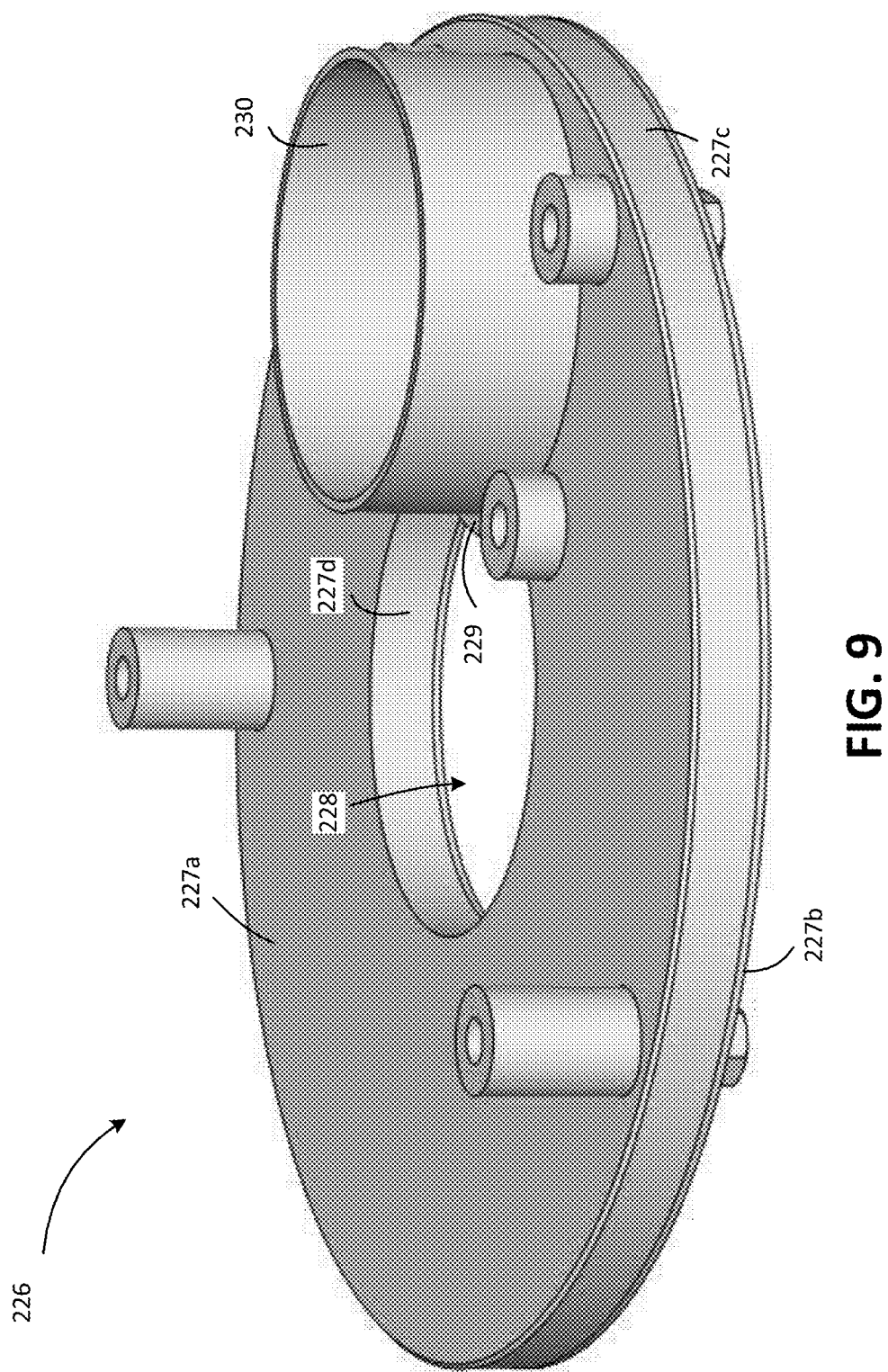
FIG. 9 is a perspective view of the flow distributor shown in FIG. 8.

Referring to FIGS. 8-9, the container 210 includes a showerhead flow distributor 226 that has an annular disc shape, with a showerhead ceiling 227a and a showerhead floor 227b, an outer showerhead sidewall 227c connecting the outer perimeters of the showerhead ceiling and floor 227a, 227b, and an inner showerhead sidewall 227d connecting the inner perimeters of the showerhead ceiling and floor 227a, 227b. This creates a porthole 228 in the flow distributor 226 that provides a channel through which chemical vapor may reach the output conduit 224 and exit the vessel 212. In one embodiment, the output conduit 224 is offset from the center of the porthole 228 to minimize splashing of chemical precursor during operation.

The flow distributor 226 is suspended below the lid 220 and positioned in axial alignment with the vessel 212 such that the vessel sidewall 216 is spaced from the outer showerhead sidewall 227c. The flow distributor 226 includes an intake conduit 230 that extends from the showerhead ceiling 227a to the bottom surface of the lid 220 and is in fluid flow communication with the inlet conduit 222. The porthole 228 has an arcuate "cut-out" (see arcuate section 229 in FIG. 10) in its shape to accommodate the inclusion of the intake conduit 230 in the flow distributor 226.

Figure 10:
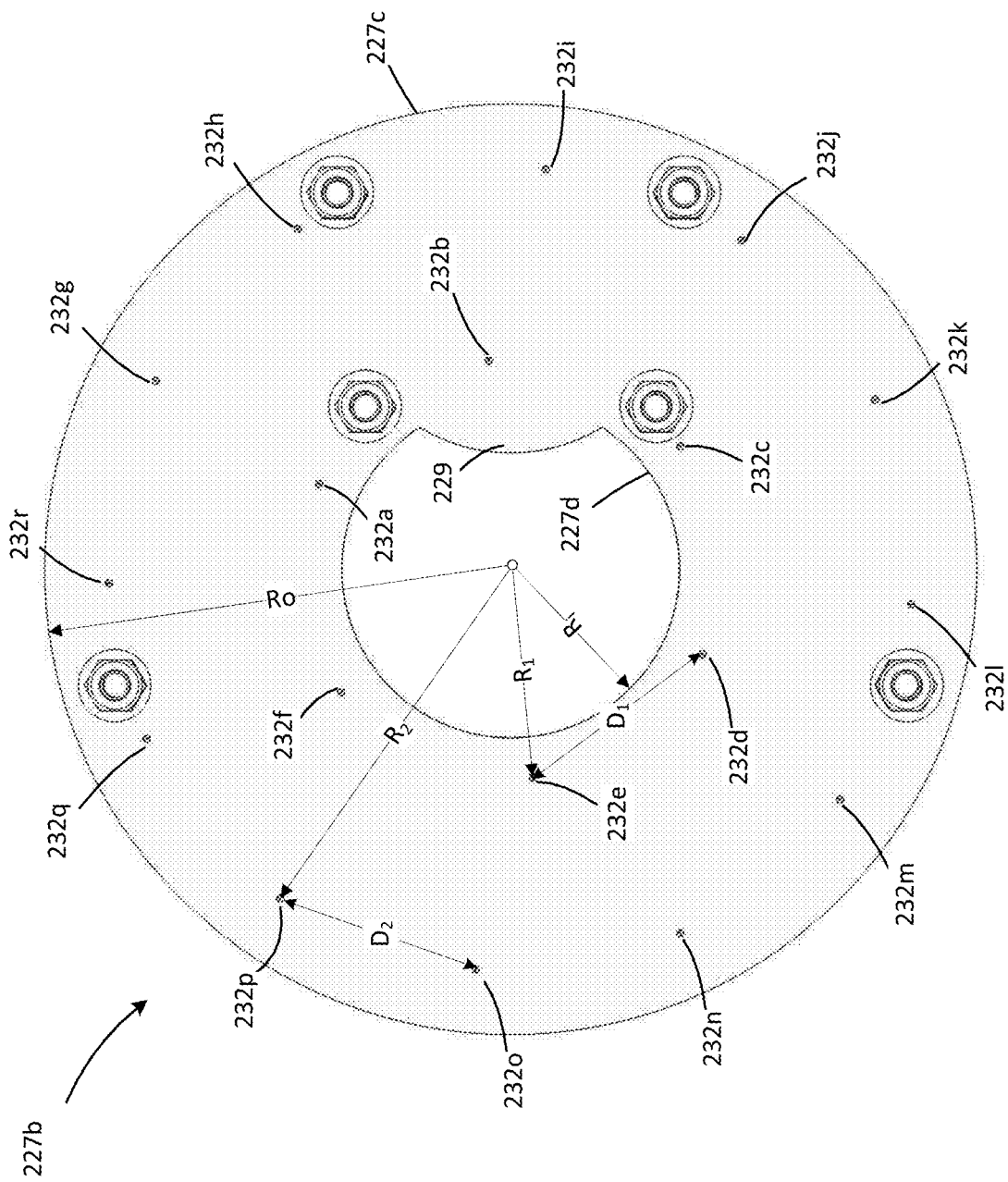
FIG. 10 is a top plan view of the showerhead floor of the flow distributor shown in FIG. 9.

Referring to FIG. 10, the showerhead floor 227b includes a plurality of apertures that define showerhead nozzles or jets 232. The jets 232 are arranged in the showerhead floor 227b in two concentric annular arrays: an inner annular array of jets 232a-f, and an outer annular array of jets 232g-r. In one embodiment, the inner jets 232a-f are arranged in a hexagonal pattern proximate to the porthole 228, while the outer jets 232g-r are arranged in a dodecagonal pattern proximate to the outer perimeter of the showerhead floor 227b. It should be noted that many, and preferably all, of the outer jets 232g-r are offset from (i.e., not in radial alignment with) any one of the inner jets 232a-f. Further, while the showerhead floor 227b shown in FIG. 10 has a 2:1 ratio of outer jets 232g-r to inner jets 232a-f, that ratio can be as small as 1.5:1 or as great as 3:1 while still performing in accordance with the principles of the invention.

In one embodiment, each of the inner jets 232a-f is spaced substantially equidistantly from its neighboring inner jets (i.e., inner jet 232a is substantially equidistant from inner jet 232b and inner jet 232f; inner jet 232b is substantially equidistant from inner jet 232c and inner jet 232a; etc.), and in another embodiment, each of the outer jets 232g-r is spaced substantially equidistantly from its neighboring outer jets (i.e., outer jet 232h is substantially equidistant from outer jet 232i and outer jet 232g; outer jet 232i is substantially equidistant from outer jet 232j and outer jet 232h; etc.). In this application, "substantially" means within a precision of 0.01, or 1%, of the distance being measured.

The radius of the inner perimeter $R_i$ of the showerhead floor, which corresponds to the radius of the inner showerhead sidewall 227d, is between 25% and 50% of the distance of the radius of the outer perimeter $R_o$, which corresponds to the radius of the outer showerhead sidewall 227c. Each of the inner jets 232a-f is spaced a radial distance $R_1$ from the center of the showerhead floor 227b, while each of the outer jets 232g-r is spaced a radial distance $R_2$ from the center of the shower head. The distance $D_1$ between each of the inner jets 232a-f and its neighboring jets is between $0.90 \cdot R_1$ and $1.10 \cdot R_1$, while the distance $D_2$ between each of the outer jets 232g-r and its neighboring jets is between $0.40 \cdot R_2$ and $0.60 \cdot R_2$. More preferably, $D_1$ is approximately equal to $R_1 \pm 0.01$ inches. while $D_2$ is between $0.45 \cdot R_2$ and $0.55 \cdot R_2$. It is preferred that $D_1$ be approximately the same across each pair of inner jets 232a-f and $D_2$ be approximately the same across each pair of outer jets 232g-r. However, as seen in FIG. 10, it is acceptable to have some variance in $D_1$ and $D_2$ across each pair of inner jets 232a-f and outer jets 232g-r, respectively.

As can be seen in FIG. 10, $R_1$ is slightly longer than $R_i$, while $R_2$ is slightly shorter than $R_o$. In one embodiment, $R_1$ is between 40% and 50% the length of $R_o$ and between 25% and 45% (more preferably between 30% and 35%) of the interior radius of the vessel sidewall 216, while $R_2$ is between 80% and 90% the length of $R_o$ and between 65% and 85% (more preferably between 75% and 80%) of the interior radius of the vessel sidewall 216. In one embodiment, the interior radius of the vessel sidewall 216 is $4.45 \pm 0.01$ inches, $R_c = 4.00 \pm 0.01$ inches, $R_i = 1.45 \pm 0.01$ inches, $R_1 = 1.80 \pm 0.01$ inches, and $R_2 = 3.45 \pm 0.01$ inches.

Each of the jets 232 in the flow distributor 226 is directed vertically downward at an angle ranging from 60° to 90° relative to the lid 220 and has an equivalent diameter ranging from 0.0010 inches (0.0025 cm) to 0.5000 inches (1.27 cm), 0.0025 inches (0.00635 cm) to 0.3000 inches (0.762 cm); or 0.0050 inches (0.0127 cm) to 0.2000 inches (0.508 cm).

In one embodiment, the jets are shaped to narrowly taper from the inside face of the showerhead floor 227b to the outer face of the showerhead floor 227b, with a wide diameter of approximately 0.0625 inches (0.159 cm) and a narrow diameter 0.0080 inches, with a precision of 0.0002 inches (20.32 mm±0.5 mm).

To impinge on the surface of the precursor, each of the jets 232a-r is preferably designed to achieve a Reynolds number greater than 50, and more preferably greater than 150, for the carrier gas. The Reynolds number is defined as the mathematical product of the nozzle inner diameter, the actual gas velocity in the jet tip, and density of the carrier gas, divided by the dynamic viscosity of the carrier gas. When determining these physical properties, the temperature and pressure inside the container headspace are used as the basis. The jets are also designed in a way to achieve as uniform as possible impingement of the carrier gas on the precursor surface.

Figure 11:
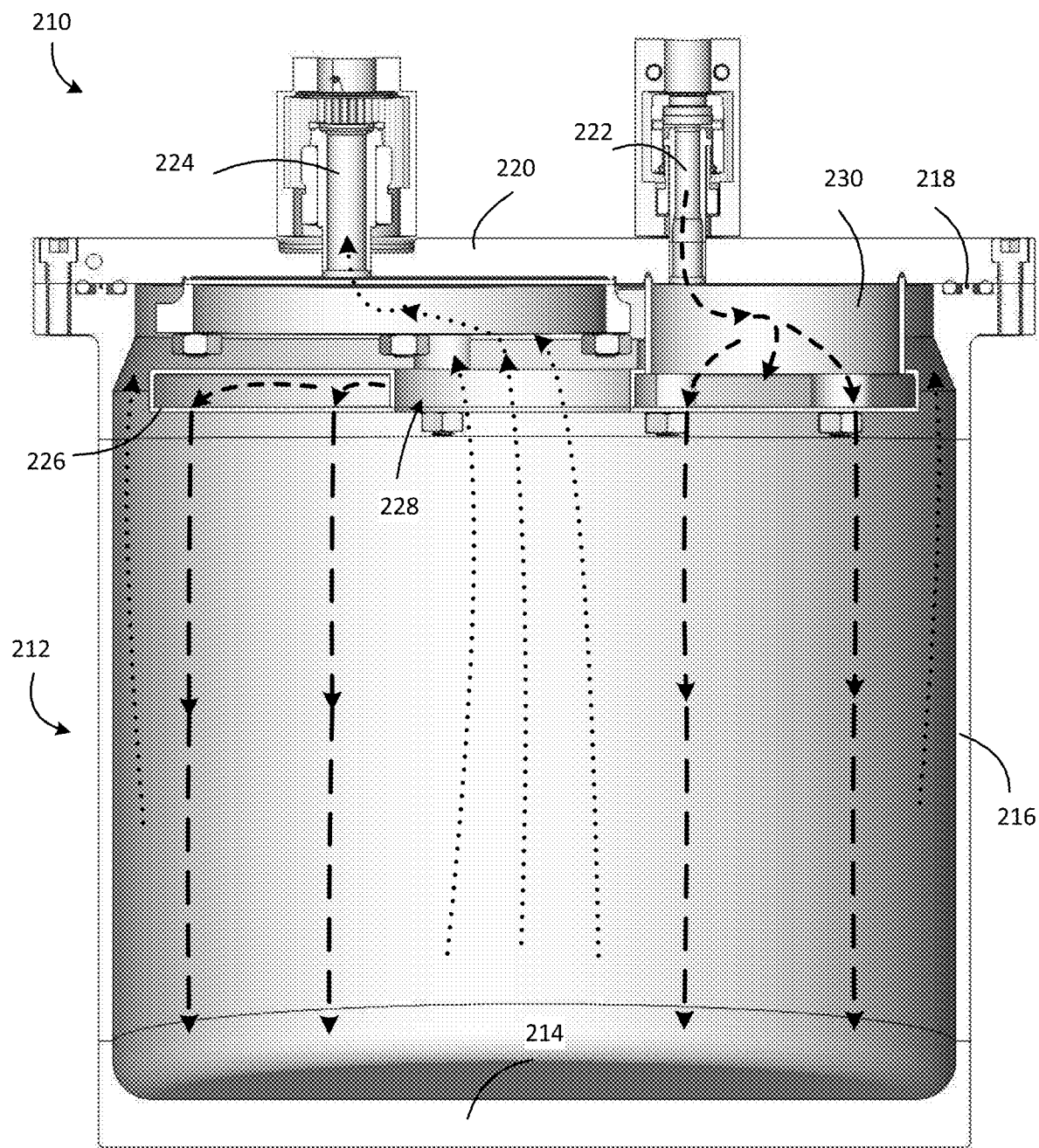
FIG. 11 is a cross-sectional view of the chemical precursor container shown in FIG. 8 and taken along the line 11-11.

FIG. 11 illustrates a method of using the container 210 to extract chemical precursor therefrom. First, carrier gas is introduced into the container 210 via the inlet conduit 222 and travels through the intake conduit 230 and into the flow distributor 226. The carrier gas is then forced through the jets 232a-r, which direct the carrier gas toward the vessel floor 214 of the container 210, causing the carrier gas to impinge upon the surface of the chemical precursor therein with sufficient momentum to perturb the precursor surface without splashing. The precursor then sublimates into a vapor, a majority of which is then carried up through the porthole 228 and into the outlet conduit 224 while the remainder travels between the outer showerhead sidewall 227c and the vessel sidewall 216 and into the outlet conduit 224.

FIGS. 12A-B and 13A-F show the results of utilizing the flow distributor 226 described above. As can be seen in FIGS. 12A and 12B, all jets from the flow distributor 226 reach the vessel floor 214 of the container 210 and provide high sheer stress on the surface of the chemical precursor therein, thereby increasing the chemical utilization rate of the container 210. And as seen in FIGS. 13A-F, the chemical utilization performance of the flow distributor 226 is consistent with varying surface levels of the precursor. More particularly, there is minimal variation in sheer stress at the precursor surface when the container 210 moves from maximum fill state (see FIGS. 13A and 13B) to a half-full state (see FIGS. 13C and 13D), and the variation in sheer stress from a half-full state to an empty state (see FIGS. 13E and 13F) is considerably better than that of prior art containers.

The material of construction of the vessels is typically stainless steel, but may be made from other materials depending on the reactivity of the precursor with the material in question. The materials of construction of the apparatus described herein exhibit one or more of the following characteristics: chemically compatible to prevent corrosion or reaction with the precursor, strong enough to support the pressures and vacuum forces used, and generally leak tight to hold vacuum from 1 mTorr to 500 mTorr depending on the process chemicals and/or solvent in use. The containers also contain one or a plurality of valves and ports and sensors, to allow access to the precursor.

In certain embodiments, one or more of the container(s) contain a level sense system, which may be disposed within or outside the container. In embodiments, wherein the level sense system is disposed within the container, the level sensing function is performed using ultrasonic level sensors or, alternatively, float probes. Other level sense techniques include, but are not limited to, thermally based level sense, differential pressure, both discrete and continuous ultrasonic level sense, capacitive, optical and microwave impulse radar level senses, and/or combinations thereof. The level sense may also be disposed outside of the reservoir. These level sense types include ultrasonic, scales/load cells, thermal, X-ray/radiation, and similar techniques. These techniques have the advantage of having no penetration into the reservoir interior, even though the accuracy of the measurement may not be quite as accurate. Ultrasonic empty sensing can be done using an ultrasonic sensor attached, clamped-on, or embedded to the delivery line, permitting the refill system to precisely gauge when no more chemical is left in the replaceable bulk tank, allowing the end-user customer to consume the majority of process chemical.

The process precursor can be selected from at least one metal complex selected from the group consisting of metal halides, metal β-diketonates, metal β-diketoesterate, metal β-ketoiminates, metal β-diiminates, metal alkyls, metal carbonyl, alkyl metal carbonyl, metal cyclopentadienyls, metal cyclopentadienyls carbonyls, metal pyrrolyls, metal imidazolyls, metal amidinates, and metal alkoxides, wherein the ligand can be monodentate, bidentate and multidentate, complexing to the metal atoms, and the metal is selected from Group 2 to 15 elements of the Periodic Table of the Elements including but not limited to Mg, Ca, Sr, Ba, Y, La, Ce, Sm, Tb, Er, Yb, Lu, Ti, Zr, Hf, Fe, Co, Ni, Ru, Ir, Rh, Cu, Al, Sn, Pb, Sb, Bi, Te, Cr, Mo and W.

All examples and conditional language recited herein are intended for pedagogical purposes to aid the reader in understanding the principles of the present invention and the concepts contributed by the inventor in furthering the art. As such, they are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It is to be understood that the embodiments described herein are merely exemplary and that a person skilled in the art may make many variations and modifications without departing from the spirit and scope of the invention. All such variations and modifications are intended to be included within the scope of the invention, as defined by the following claims.

The invention claimed is:

1. A container for delivering a chemical precursor to a process tool, comprising:
   a vessel including a vessel floor, a vessel sidewall extending from the vessel floor to an upper vessel edge, and a lid that spans a radial distance from a center axis of the vessel to the upper vessel edge, the vessel floor, the vessel sidewall, and the lid of the vessel defining an interior volume in the vessel, the vessel having an exterior surface and an interior surface;
   an inlet conduit extending through the vessel from the exterior surface of the vessel to the interior surface of the vessel;
   a flow distributor positioned inside the vessel and in fluid flow communication with the inlet conduit, the flow distributor including at least one conduit having a plurality of apertures formed therein for expelling gas from the inlet conduit into the vessel; and
   an outlet conduit in fluid flow communication with the interior volume of the vessel, wherein the flow distributor includes a distributor floor, a distributor ceiling, an outer distributor sidewall that extends from an outer perimeter of the distributor floor to an outer perimeter of the distributor ceiling, and an inner distributor sidewall that extends from an inner perimeter of the distributor floor to an inner perimeter of the distributor ceiling, the distributor floor and distributor ceiling spanning from the inner perimeters thereof, respectively, to the outer perimeters thereof, respectfully; and wherein the inner distributor side wall defines a porthole in the flow distributor that allows fluid to pass through the flow distributor from the interior volume of the vessel to the outlet conduit.

2. The container of claim 1, wherein the flow distributor has an annular shape; and the plurality of apertures are formed in the distributor floor of the flow distributor and are arranged in a plurality of concentric annular arrays of apertures that include an inner array of apertures and an outer array of apertures, wherein a radius of the inner array of apertures is shorter than a radius of the outer array of apertures; wherein the inner array of apertures are either radially offset or radically non-offset from the outer array of apertures.

3. The container of claim 2, wherein the flow distributor and the vessel are in axial alignment, the vessel has an interior vessel radius, and the outer array of apertures is positioned radially between 65% and 85% of the interior vessel radius.

4. The container of claim 2, wherein (1) each of the inner array of apertures is substantially equidistant from its neighboring apertures in the inner array of apertures; (2) each of the outer array of apertures is substantially equidistant from its neighboring apertures in the outer array of apertures; or a combination of (1) and (2).

5. The container of claim 4, wherein a distance between two apertures in the inner array of apertures is substantially equal to the radius of the inner array of apertures.

6. The container of claim 2, wherein a ratio of outer apertures of the outer array of apertures to inner apertures of the inner array of apertures is between 1.5:1 and 3:1.

7. The container of claim 1, wherein the porthole of the flow distributor and the vessel are in axial alignment, the vessel has an interior vessel radius, and the porthole has a radius that is between 25% and 35% of the interior vessel radius.

8. The container of claim 1, wherein the output conduit is offset from a center of the porthole of the flow distributor.

9. The container of claim 1, wherein the vessel has an upper section and a lower section, the upper section being located between the lid and the distributor ceiling, and the lower section being located between distributor floor and the vessel floor; and wherein the outlet conduit is in fluid flow communication with the upper section of the vessel.

10. The container of claim 1, wherein the apertures in the flow distributor have an equivalent diameter >0.001 inches (0.0025 cm) and <0.50 inches (1.27 cm).

* * * * *